US011916561B1

(12) United States Patent
Hu et al.

(10) Patent No.: US 11,916,561 B1
(45) Date of Patent: Feb. 27, 2024

(54) ADAPTIVE ALIGNMENT OF SAMPLE CLOCKS WITHIN ANALOG-TO-DIGITAL CONVERTERS

(71) Applicant: Avago Technologies International Sales Pte. Limited, Singapore (SG)

(72) Inventors: Boyu Hu, Irvine, CA (US); Chang Liu, Irvine, CA (US); Guansheng Li, Irvine, CA (US); Haitao Wang, Irvine, CA (US); Delong Cui, Tustin, CA (US); Jun Cao, Irvine, CA (US)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 215 days.

(21) Appl. No.: 17/582,641

(22) Filed: Jan. 24, 2022

(51) Int. Cl.
*H03M 1/06* (2006.01)
*G06F 1/06* (2006.01)
*H03K 5/13* (2014.01)
*H03L 7/087* (2006.01)
*H03K 5/00* (2006.01)

(52) U.S. Cl.
CPC ............ *H03M 1/0607* (2013.01); *G06F 1/06* (2013.01); *H03K 5/13* (2013.01); *H03L 7/087* (2013.01); *H03K 2005/00052* (2013.01)

(58) Field of Classification Search
CPC .... H03M 1/12; H03M 1/1215; H03M 1/0624; H03M 1/0836; H03M 1/0607
See application file for complete search history.

(56) References Cited

U.S. PATENT DOCUMENTS

| | | | | |
|---|---|---|---|---|
| 5,459,453 A | * | 10/1995 | Minerd | G08C 15/12 710/1 |
| 7,568,137 B1 | * | 7/2009 | Kellermann | H04L 1/0045 714/755 |
| 8,564,332 B2 | * | 10/2013 | Mathur | H03K 5/19 327/198 |
| 8,861,667 B1 | * | 10/2014 | Zerbe | H04L 7/0087 379/398 |
| 8,902,094 B1 | * | 12/2014 | Zhang | H03L 7/0814 341/122 |
| 9,036,764 B1 | * | 5/2015 | Hossain | H04L 7/0337 375/376 |
| 9,608,611 B1 | * | 3/2017 | Hearne | H03K 5/135 |
| 9,917,607 B1 | * | 3/2018 | Zhang | H04L 25/085 |
| 10,243,614 B1 | * | 3/2019 | Ulrich | H03K 19/21 |
| 10,256,845 B1 | * | 4/2019 | Yüksel | H03M 13/4184 |
| 10,903,838 B1 | * | 1/2021 | Brunn | G06F 1/08 |
| 11,545,980 B1 | * | 1/2023 | Lee | H04L 7/0334 |
| 11,683,023 B1 | * | 6/2023 | Forbes | H03H 11/265 327/278 |

(Continued)

*Primary Examiner* — Lam T Mai
(74) *Attorney, Agent, or Firm* — Quarles & Brady LLP

(57) ABSTRACT

An apparatus may include a first clock generator configured to receive an input clock signal, and generate two or more first-level clock signals of a track-and-hold circuit, a phase interpolator configured to generate an interpolated clock signals, wherein the interpolated clock signal is based on the two or more first-level clock signals, and a second clock generator configured to generate two or more second-level clock signals based on the interpolated clock signal, wherein the phase of the two or more second-level clock signals relative to the phase of a respective first-level clock signal is determined, at least in part, by the phase of the interpolated clock signal.

20 Claims, 6 Drawing Sheets

(56) References Cited

U.S. PATENT DOCUMENTS

| | | | |
|---|---|---|---|
| 2007/0258552 A1* | 11/2007 | Streibl | H04L 7/0054 375/355 |
| 2009/0256733 A1* | 10/2009 | Kim | H03M 1/002 341/136 |
| 2010/0046683 A1* | 2/2010 | Beukema | H04L 7/0062 375/355 |
| 2010/0091927 A1* | 4/2010 | Walker | H03L 7/0998 375/374 |
| 2011/0115536 A1* | 5/2011 | Agarwal | H03L 7/0816 327/158 |
| 2012/0098571 A1* | 4/2012 | Feist | G01R 31/31727 327/10 |
| 2012/0177160 A1* | 7/2012 | Abe | H04L 7/0331 375/362 |
| 2013/0049831 A1* | 2/2013 | Nedachi | H03K 5/135 327/158 |
| 2014/0070849 A1* | 3/2014 | Feist | G01R 29/027 327/10 |
| 2017/0134189 A1* | 5/2017 | Sadeghi-Emamchaie | H04L 27/2627 |
| 2017/0287458 A1* | 10/2017 | Kaczynski | H03L 7/197 |
| 2018/0083638 A1* | 3/2018 | Tajalli | H03L 7/0995 |
| 2018/0083809 A1* | 3/2018 | Tajalli | H03L 7/0995 |
| 2018/0191355 A1* | 7/2018 | Dusad | G06F 1/08 |
| 2019/0052227 A1* | 2/2019 | Tröger | H04L 27/2695 |
| 2019/0377701 A1* | 12/2019 | Mishra | G06F 13/364 |
| 2021/0019118 A1* | 1/2021 | Fu | G06F 5/06 |
| 2022/0077867 A1* | 3/2022 | An | H03M 1/1061 |
| 2022/0158649 A1* | 5/2022 | Zhang | H03M 1/1245 |
| 2023/0204780 A1* | 6/2023 | Shettigara | G01S 7/4865 356/5.09 |
| 2023/0283290 A1* | 9/2023 | Kossel | H03M 1/1215 341/166 |

* cited by examiner

ADAPTIVE ALIGNMENT OF SAMPLE CLOCKS WITHIN ANALOG-TO-DIGITAL CONVERTERS

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for sample clock alignment in analog-to-digital converters.

BACKGROUND

Time-interleaved analog-to-digital converters (TI-ADC) have been widely used for various systems. TI-ADCs include large numbers of individual unit-ADCs requiring multi-level sampling stages to capture and de-multiplex wide-band input signals for digitizing by unit-ADCs. Given the large number of unit ADCs within a TI-ADC, it is often required to have multi-levels of sampling stages to capture and de-multiplex the wide-band input signal for digitization by the unit-ADCs. Alignment of the high-speed sample clocks between different levels directly affects the signal conversion quality from analog-to-digital domain. Due to the logic depth differences of the clock generators for different levels of sample clocks, the delay time along different clock paths can show both different values and large process/voltage/temperature/parasitic extraction (PVTE) variations.

Thus, methods, systems, and apparatuses for sample clock alignment in ADCs are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
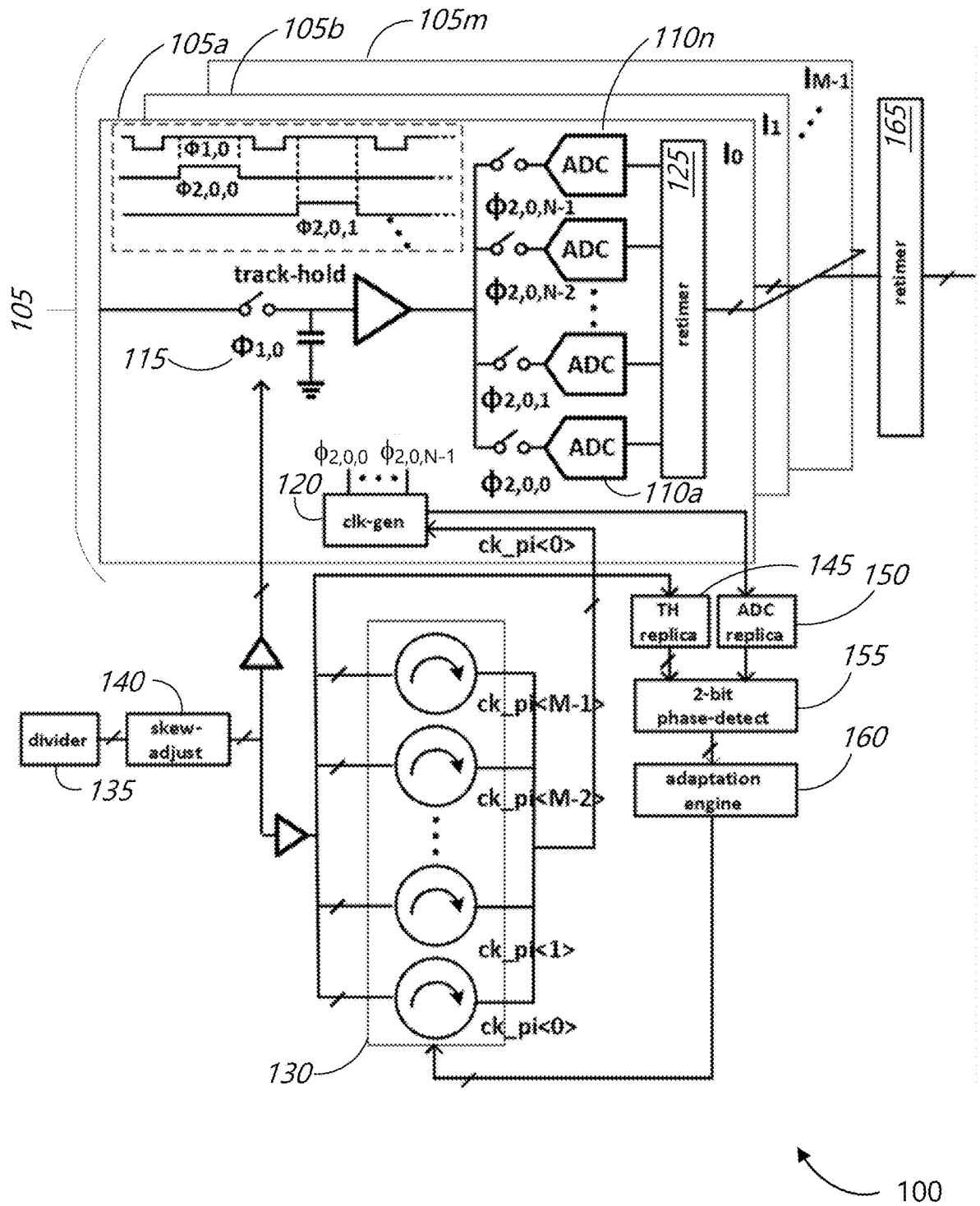
FIG. 1 is a schematic block diagram of an adaptive alignment sample-clock system architecture, in accordance with various embodiments.

Various embodiments provide tools and techniques for adaptive alignment of sample-clocks in ADCs.

In some embodiments, a method for adaptive alignment of sample clocks in ADCs is provided. The method may include generating, via a first clock generator, two or more first-level clock signals of a track and hold circuit based on an input clock signal, each of the two or more first-level clock signals separated by a phase offset of 1xT from a respective first-level clock signal of a neighboring phase, and generating, via a phase interpolator, an interpolated clock signal. Generating the interpolated clock signal may further include selecting an even-numbered first-level clock signal of the two or more clock signals, selecting an odd-numbered first-level clock signal of the two or more clock signals, the odd-numbered first-level clock signal having a phase neighboring a phase of the even-numbered first-level clock signal, weighting the even-numbered first-level clock signal by a first weighting factor to produce a weighted even-numbered first-level clock signal, and weighting the odd-numbered first-level clock signal by a second weighting factor to produce a weighted odd-numbered first-level clock signal. The method may continue by generating the interpolated clock signal based on the weighted even-numbered first-level clock signal and the weighted odd-numbered first-level clock signal, wherein the interpolated clock signal has a phase within the 1xT phase offset between the even-numbered and odd-numbered first-level clock signals. The method further includes generating, via a second clock generator, two or more second-level clock signals based on the interpolated clock signal, wherein the phase of the two or more second-level clock signals relative to the phase of a respective first-level clock signal is determined, at least in part, by the phase of the interpolated clock signal.

In some embodiments, an apparatus for adaptive alignment of sample clocks in ADCs is provided. The apparatus may include a first clock generator configured to receive an input clock signal, and generate two or more first-level clock signals of a track-and-hold circuit, and a phase interpolator configured to generate an interpolated clock signals, wherein the interpolated clock signal is based on the two or more first-level clock signals. The phase interpolator may include a first multiplexer configured to receive even-numbered first-level clock signals of the two or more first-level clock signals and a second multiplexer configured to receive odd-numbered first-level clock signals of the two or more first-level clock signals. The phase interpolator may further include a first digital-to-analog converter configured to generate a first vector of a selected even-numbered first-level clock signal from the first multiplexer, weighted by a first weighting factor, and a second digital-to-analog converter configured to generate a second vector of a selected odd-numbered first-level clock signal from the second multiplexer, weighted by a second weighting factor. The outputs of the first and second digital-to-analog converters may be configured to be added, wherein the added first and second vectors form the interpolated clock signal, and wherein the respective interpolated clock signal has a phase within the 1xT phase offset between the even-numbered and odd-numbered first-level clock signals. The apparatus may further include a second clock generator configured to generate two or more second-level clock signals based on the interpolated clock signal, wherein the phase of the two or more second-level clock signals relative to the phase of a respective first-level clock signal is determined, at least in part, by the phase of the interpolated clock signal.

In in further embodiments, a system for adaptive alignment of sample clocks in ADCs is provided. The system may include a first clock generator configured to receive an input clock signal, and generate two or more first-level clock signals of a track-and-hold circuit, and a phase interpolator configured to generate two or more respective interpolated clock signals, wherein each respective interpolated clock signal is based on the two or more first-level clock signals, wherein the phase interpolator further comprises two or more phase interpolator slices. Each respective phase interpolator slice may further include a first multiplexer configured to receive even-numbered first-level clock signals of the two or more first-level clock signals, and a second multiplexer configured to receive odd-numbered first-level clock signals of the two or more first-level clock signals. Each respective phase interpolator slice may further include a first digital-to-analog converter configured to generate a first vector of a selected even-numbered first-level clock signal from the first multiplexer, weighted by a first weighting factor, and a second digital-to-analog converter configured to generate a second vector of a selected odd-numbered first-level clock signal from the second multiplexer, weighted by a second weighting factor. The outputs of the first and second digital-to-analog converters are configured to be added, wherein the added first and second vectors form a respective interpolated clock signal, wherein the respective interpolated clock signal has a phase within the 1xT phase offset between the even-numbered and odd-numbered first-level clock signals. The system may further include two or more analog-to-digital converter slices. Each respective analog-to-digital converter slice may further include a second clock generator configured to generate two or more second-level clock signals based on the respective interpolated clock signal, wherein the phase of the two or more second-level clock signals relative to the phase of a respective first-level clock signal is determined, at least in part, by the phase of the respective interpolated clock signal.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the procedures of the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this description, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional approaches to clock alignment exhibit drawbacks, such as a degraded clock signal, inability to control or worsened PVTE variation, and increased power requirements. These techniques focus on additional components, such as stacked delay elements, or fixed phase selections, which otherwise introduce additional complexity and inefficiency, increases in power consumption, or lacks the ability to scale in real-time, with in-situ conditions.

Thus, the embodiments set forth below allow for a more robust, scalable, and power efficient way to align sample clock signals. Specifically, the embodiments below describe the design and use of an M-phase input/M-phase output phase interpolator to generate and adjust second-level clock signals in a track-and-hold circuit, as well as adaptation logic to adjust the alignment of respective sample clock signals.

To the extent any abstract concepts are present in the various embodiments, those concepts can be implemented as described herein by devices, logic, systems, and methods that involve novel functionality (e.g., steps or operations), such as the adaptive alignment of sample clocks within an ADC, utilizing an M-phase input/output phase interpolator. Advantages of the approaches set forth below can include a highly power and area efficient approach to sample clock alignment. The proposed embodiments may utilize the M-phase input/output phase interpolator as both an adaptive sample clock alignment circuit and internal clock channel driver. In some examples, by replacing the original channel driver, no additional power consumption or silicon area on the high-speed clock path may be needed. Moreover, the embodiments below may provide multi-level sample clock alignment, with coverage range of the whole sample window, together with very fine adjustment step. Embodiments can advantageously provide precise detection of alignment error and create a stable time-margin against sample timing introduced performance degradation. Moreover, time-margins can be flexibly re-defined on-the-fly for performance optimizations. For example, as will be described in greater detail below, the system adaptively adjusts sample clock alignment against any PVTE variations and data-rate changes.

Moreover, some embodiments set forth below may run in the background without disturbing the normal operation of the TI-ADC and DSP, thus avoiding any increases to computational overhead. Some examples set forth below may also allow time-interleaved ADCs to push the maximum sampling speed, while mitigating timing related sample error. For example, the new design has reached >180 GS/s in experimental testing. Further examples may allow time-interleaved ADCs to cover a much wider range of the data rate, which is critical for multi-standard-compliant SerDes applications. For example, a data range as large as 40 GS/s to 56 GS/s can be covered in latest generation ADC-DSP based SerDes chips in 5 nm, and can support down to 10 GS/s mode in coming generations.

FIG. 1 is a schematic block diagram of a system 100 for sample clock alignment in ADCs. The system 100 includes ADC 105, which includes one or more ADC slices 105a-105m, one or more sub-ADCs 110a-110m, first-level clock signal 115, clock generator 120, slice retimer circuit 125, M-phase in/out phase interpolator 130, clock divider 135, skew-adjustment circuit 140, track-and-hold replica circuit 145, ADC replica circuit 150, 2-bit phase detector 155, adaptation engine 160, and ADC retimer circuit 165. It should be noted that the various components of the system 100 are schematically illustrated in FIG. 1, and that modifications to the various components and other arrangements of system 100 may be possible and in accordance with the various embodiments.

In various embodiments, the ADC 105 may include one or more ADC slices 105a-105m, which may include a first ADC slice 105a ($I_0$) through a m-th ADC slice 105m ($I_{M-1}$), where "m" is an integer. Thus, in various examples, the ADC 105 may be a time-interleaved ADC comprising the one or more ADC slices. The first ADC slice 105a may include a first-level clock signal 115 ($\phi_{1,0}$) of the track-and-hold (T&H) circuit (e.g., a multi-level T&H circuit), which may be generated, in some embodiments, by a clock generator, such as a first clock generator. In various examples, a T&H circuit, also referred to as "sample-and-hold" circuit, may be an input sampling circuit of the ADC 105. As shown in FIG. 1, the T&H circuit may be represented as the analog switch and capacitor. The circuit may operate in "track" mode when the switch is closed, tracking the input signal (e.g., the first-level clock signal 115), and in "hold" mode when the switch is open, holding the last instantaneous value of the input signal held at the capacitor.

In some examples, the clock generator 120 may include the first clock generator. In various examples, the one or more second-level ADC clock signals ($\phi_{2,0,0}$, $\phi_{2,0,1}$, ..., $\phi_{2,0,N-1}$) may be generated by the clock generator 120 based on a respective interpolated clock signal ck_pi<0:M-1>, and in the illustrated example, the second-level ADC clock signals may be generated based on a first interpolated clock signal ck_pi<0>. In some examples, the clock generator 120 may be a second clock generator configured to generate second-level clock signals of the T&H circuit. The first ADC slice 105a may further include one or more sub-ADCs 110a-110n, which may include a first sub-ADC 110a through an n-th sub-ADC 110n, where "n" is an integer. The outputs of each of the sub-ADCs 110a-110n may be output to a slice retimer circuit 125, which may be configured to align the outputs from each sub-ADC to the same clock phase, such that the ADC slice 105a may output data to the ADC retimer circuit 165 for further retiming with each respective ADC slice 105a-105m. Each ADC slice 105a-105m may include similar respective sets of components corresponding to the components of the first ADC slice 105a.

In various examples, an input clock signal, for example an I/IB/Q/QB clock from a receiver phase-locked loop (PLL), may be divided via divider 135. Divider 135 may be a clock divider, configured to divide the input clock into M-number of divided clocks corresponding to each channel (e.g., ADC slice 105a-105m) of the ADC 105. The divided clock signals are then provided to skew-adjustment circuit 140, which may be configured to remove the sampling time mismatch at the T&H. In some examples, the clock skew may be adjusted by adjusting a number of clock inverters that are turned on. Thus, in various examples, the first-level clock signal 115 may be generated, and provided to a respective ADC slice 105a-105m, and further to an M-phase in/out phase interpolator 130.

In various embodiments, the M-phase in/out phase interpolator 130 may include an M-number of interpolator slices, each interpolator slice accepting an M-phase input (ck<0:M-1>) and generating an M-phase output (ck_pi<0:M-1>). The first-level clock signal may be extracted via a TH replica circuit 145, and replicated for adaptation of the second-level clock-signals via the M-phase in/out phase interpolator 130. The second-level ADC clock signals may similarly be extracted from the clock generator 120 via ADC replica circuit 150, and replicated. In various examples, the ADC replica circuit 150 may include a respective circuit for extracting each respective second-level clock signals for each sub-ADC. The outputs of the TH replica circuit 145 and ADC replica circuit 150 may be provided to 2-bit phase detector 155. In some examples, the 2-bit phase detector 155 may be configured to detect the relative positions of the sample clocks of the first-level clock signal and each of the respective second-level ADC clock signals. The output of the two-bit phase detector 155 may be coupled to the adaptation engine 160.

In various embodiments, the adaptation engine 160 may be configured to adapt to clock-rate changes, and process, voltage, temperature, and extraction (PVTE) variations, based on the detected relative positions of the sample clocks. Thus, the adaptation engine may output a phase interpolator control signal for adjusting the output of the M-phase in/out interpolator 130, which may in turn adjust the input clock of the clock generator 120.

Thus, an M-phase input/M-phase output phase interpolator (e.g., the M-phase in/out phase interpolator 130) generates adjusted second-level ADC clocks, (e.g., sample clocks) inside each ADC slice 105a-105m of ADC 105, through background adaptive control algorithms controlled via the adaptation engine 160. The M-phase in/out phase-interpolator serves the purpose of both adjusting the timing between the first-level and second-level sample clocks (e.g., the first-level clock signals and second-level ADC clock signals), and driving a long routing clock distribution channel inside the ADC 105. Moreover, adjustment via the M-phase in/out phase interpolator 130 allows adjustment over the whole period of the first-level sample clock with a resolution of M-steps, thus allowing alignment of the second-level sample clocks (e.g., the second-level ADC clock signals). Sample clock alignment resolution inherently scales as input data rate changes, thus alignment via the M-phase in/out phase interpolator 130 further supports very wide data-rate ranges.

In further embodiments, time-margins of the second-level ADC clock signals may be adjusted via the M-phase in/out phase interpolator 130. Specifically, the relative positions of the sample clocks of the first-level track-and-hold (e.g., first-level clock signal) and second-level ADC (e.g., second-level ADC clock signals) may be extracted and/or replicated through replica circuits, TH replica circuit 145 and ADC replica circuit 150, respectively. As previously described, the relative positions (e.g., phase) of the sample clocks may be detected via the 2-bit phase detector 155, while the first-level clock signal is left undisturbed. The sample clock alignment time-margin is defined utilizing phases, and thus inherently scales as input data rate changes, and may be redefined on-the-fly as appropriate.

Thus, the adaptation engine 160 may be configured to combine control of the M-phase in/out phase interpolator 130 with a 2-bit alignment-error detection scheme and background adaptation algorithms to provide real-time, on-line tracking of clock-rate changes, and PVTE variations. With the fine unit-time step afforded by the M-phase in/out phase interpolator 130, real-time and in-situ adaptation is supported without disturbing the timing requirements inside the ADC 105 digital logic, and interfaces between the ADC 105 and a DSP core.

Figure 2:
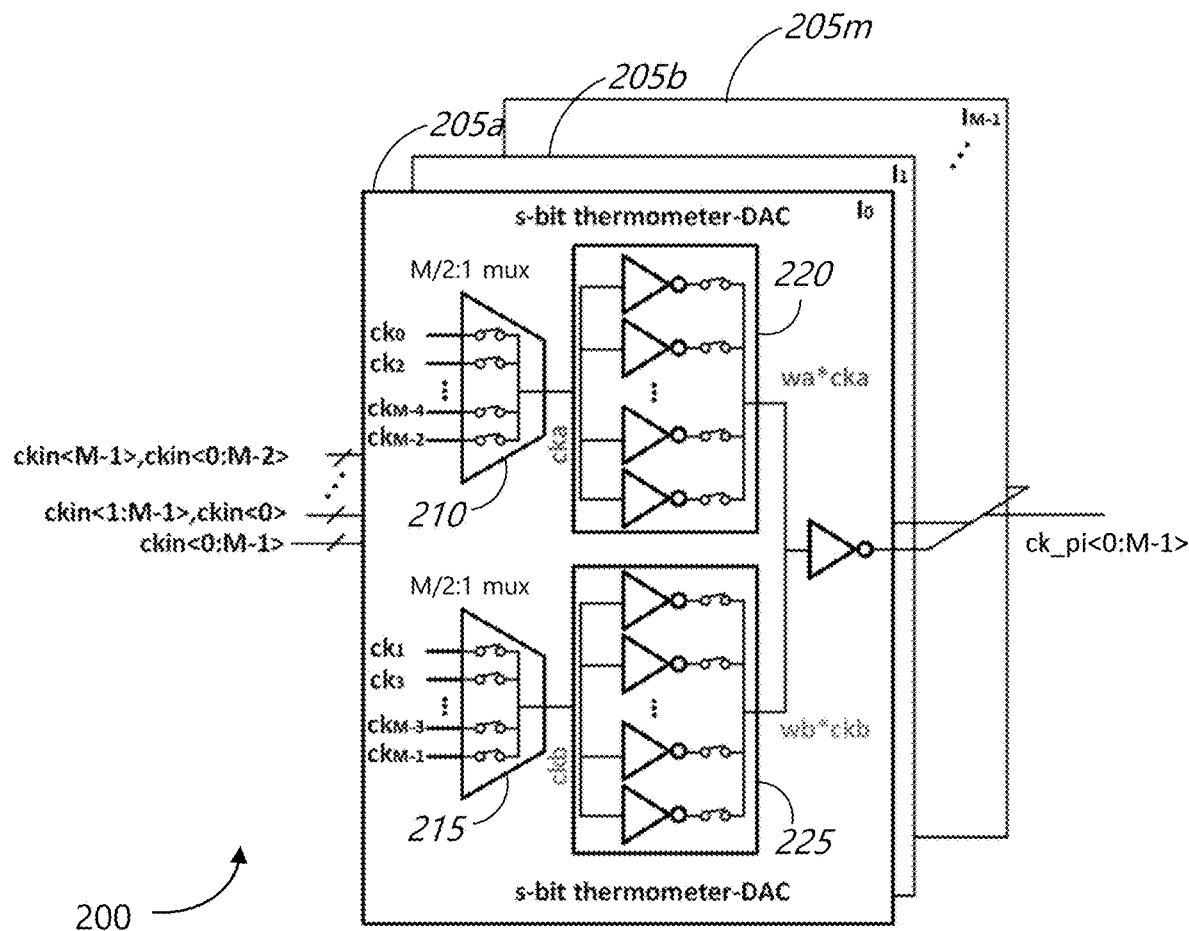
FIG. 2 is a schematic diagram of an M-phase in/out phase interpolator, in accordance with various embodiments.
Figure 2:
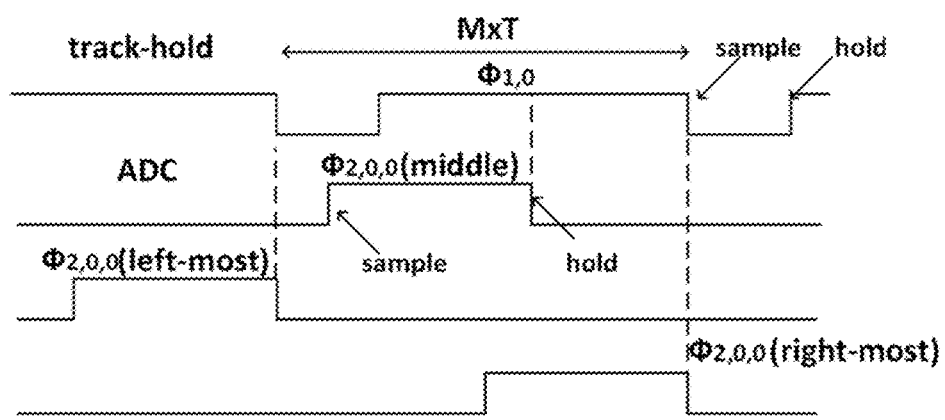

FIG. 2 is a schematic diagram of an M-phase in/out phase interpolator 200 (hereinafter, "PI 200"), in accordance with various embodiments. The PI 200 includes one or more PI slices 205a-205m, which may include a first PI slice 205a ($I_0$) through an m-th PI slice 205m ($I_{M-1}$). The first PI slice 205a may include a first multiplexer 210 and a second multiplexer 215, which are respectively coupled to a first digital-to-analog converter (DAC) 220 and second DAC 225. It should be noted that the various components of the PI 200 are schematically illustrated in FIG. 2, and that modifications to the various components and other arrangements of PI 200 may be possible and in accordance with the various embodiments.

Accordingly, in various embodiments, each PI slice 205a-205m may take an M-phase input (with 1xT space between each neighboring phase), and generate an M-phase output. Each PI slice 205a-205m is coupled to the M-phase input clock (e.g., first-level clock signal) such that it advances 1-phase from a preceding slice in a cyclic way, enforcing a phase relationship of the output M-phase signal, ck_pi. The output of the PI 200 may be an M-number of a clock signals, ck_pi<0:M−1>, where each clock signal ck_pi$_0$ to ck_pi$_{M-1}$, are phase shifted clock signals over the time period MxT (e.g., one period of the first-level clock), separated by M-number of steps (e.g., a 1xT space between neighboring phases). Thus, continuing with the example above, signals (such as the one or more first-level clock signal, one or more second-level clock signals, and/or one or more interpolated clock signals) with neighboring phases are signals that are closest in phase in the MxT space. In some examples, the second-level ADC clock signal $\phi_{2,0,0}$ may be adjusted such that a falling edge of the second-level ADC clock signal $\phi_{2,0,0}$ may correspond to the entire MxT time period of the first-level clock signal, based on phase shifts of a respective interpolated clock signal ck_pi (e.g., ck_pi$_0$).

Each PI slice 205a-205m may respectively include two multiplexers, first multiplexer 210 and second multiplexer 215. In some examples, the first and second multiplexers 210, 215 may be M/2:1 multiplexers. Accordingly, the first multiplexer 210 may be coupled to even-numbered input clock signals (ck$_0$-ck$_{M-2}$), such as even numbered first-level clock signals, whereas the second multiplexer 215 may be coupled to odd-numbered input clock signals (ck$_1$-ck$_{M-1}$), such as odd numbered first-level clock signals. In various examples, the output of the first multiplexer 210 may be denoted as cka, while the output of the second multiplexer 215 may be denoted as ckb. The paired outputs cka and ckb may thus provide any neighboring two phases of clock signals, across the whole MxT range, with a 1xT time spacing between the neighboring phases. In some examples, the neighboring phases may be set through an even-side and odd-side multiplexer selection code.

In various examples, the outputs cka and ckb may be weighted via respective DACs, first DAC 220 and second DAC 225. In some examples, the first DAC 220 and second DAC 225 may be s-bit thermometer DACs. The first DAC 220 may weight cka by a first weighting factor wa, and second DAC 225 may weight ckb by a second weighting factor wb. Accordingly, the weighted clock signals wa*cka and wb*ckb may be added, in vector form, through the two output-connected s-bit thermometer-DACs to generate the interpolated clock signal ck_pi within the 1xT timing spacing. In some further examples, a phase within the 1xT timing space may be selected by selection of weighting factors wa and wb.

The second-level ADC clock signal, $\phi_{2,i,j}$, of each ADC slice 105a-105m may move following the phase-interpolator's output. Thus, the whole MxT time period of the first-level clock signal $\phi_{1,i}$ of the T&H may be covered, and alignment between these two levels may be adjusted and a desired alignment achieved.

Figure 3:
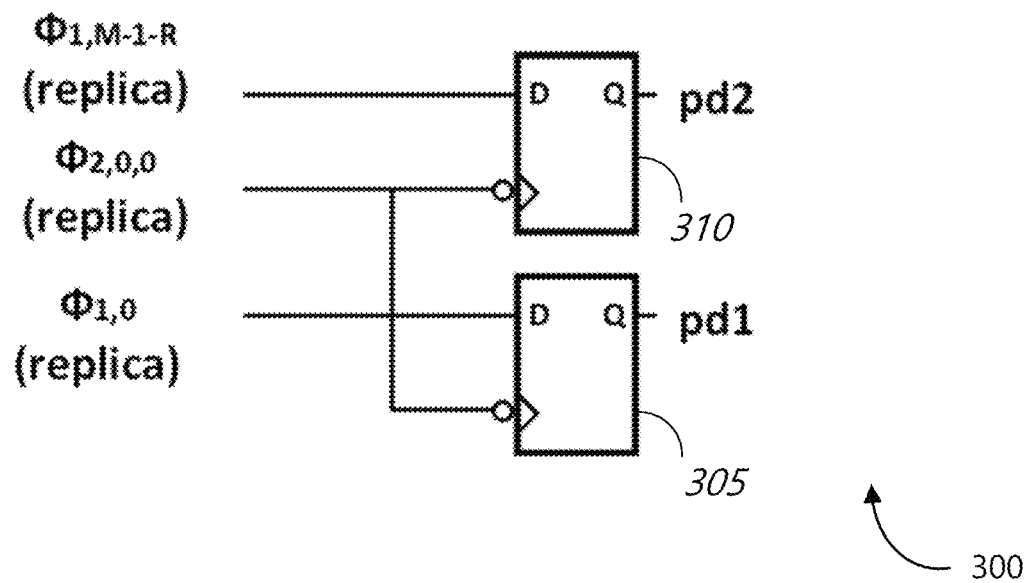
FIG. 3 is a schematic diagram of a 2-bit phase detector for time-margin setup, in accordance with various embodiments.
Figure 3:
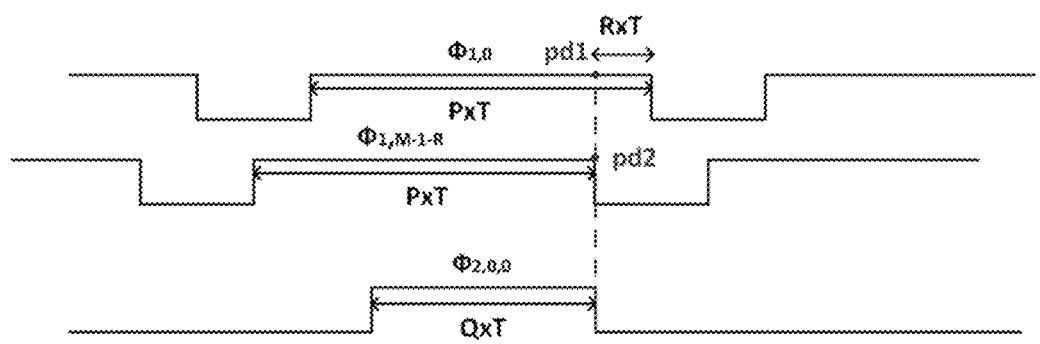

FIG. 3 is a schematic diagram of a 2-bit phase detector 300 (hereinafter "PD 300") for time-margin setup, in accordance with various embodiments. The 2-bit phase detector 300 may include a first phase detector 305 and second phase detector 310. It should be noted that the various components of the PD 300 are schematically illustrated in FIG. 3, and that modifications to the various components and other arrangements of PD 300 may be possible and in accordance with the various embodiments.

In some examples, the first and second phase detectors 305, 310 may include, for example, a flip-flop. In one example, the first and second phase detectors 305, 310 may be implemented as D flip-flops. In various embodiments, an input of the first phase detector 305 may be configured to accept a replicated first first-level clock signal $\phi_{1,0}$ from TH replica circuit 145 of FIG. 1. Thus, the replicated first-level clock signal may be used as a reference for the first phase detector 305 (e.g., a D flip-flop). Similarly, the input of the second phase detector 310 may be configured to accept a replicated (M−1−R)th first-level clock signal $\phi_{1,M-1-R}$. Each of the reference signals $\phi_{1,0}$ and $\phi_{1,M-1-R}$ may be clocked by the replicated second-level ADC clock $\phi_{2,0,0}$, (e.g., at a clock input of a D flip-flop) which in some examples, may be obtained from ADC replica circuit 150 of FIG. 1.

In various embodiments, a left-margin of the second-level ADC clock may be defined as the time-space between a rising-edge (hold-edge) of the first-level track-and-hold clock (e.g., first-level clock signal) $\phi_{1,0}$ and the rising-edge (sample-edge) of second-level ADC clock $\phi_{2,0,0}$. Any time violation may lead to overlap of the settling time window of track-hold and ADC. A right-margin may be the time-space between falling-edge (sample-edge) of the first-level track-hold clock and the falling-edge (hold-edge) of the second-level ADC clock. Any time violation may lead to incorrect sampled data. Thus, sample clocks may be aligned to ensure appropriate left and right-margins.

In some examples, an alignment target may be set to adaptively keep the falling-edge (sample-edge) of the second-level ADC clock from the falling-edge of the first-level clock by a time space RxT. Thus, in some examples, RxT may be set to (PxT−QxT)/2. As shown in the example timing diagram, in such examples, the left-margin & right-margins may be evenly distributed (e.g., set equal to each other).

Thus, by using an (M−1−R)th first-level clock signal, where M−1−R is an integer, the phase relationship between the first-level clock signals may be leveraged to generate the proper time margin. In other words, inherent time differences between the different phases of the first-level clock signal are utilized to set-up references for time-margins. Specifically, the replicated first-level clock signal $\phi_{1,0}$ may be used as the reference of pd1, and replicated first-level clock signal $\phi_{1,M-1-R}$ as the reference of pd2. For the right-margin, the two reference waveforms may be sampled by the falling-edge of the replicated second-level ADC clock $\phi_{2,0,0}$ to create RxT right-margin.

In some examples, the PD 300 may be placed in lock status. In lock status, pd2 may be aligned to a falling-edge of replicated $\phi_{1,M-1-R}$ while, pd1 is a time margin RxT away from the falling-edge of replicated $\phi_{2,0,0}$. Thus, lock status inherently provides the targeted time-margin as the time difference between the two bits, pd1 and pd2, of the PD 300. In further examples, the 2-bits of PD 300 may provide 1-bit more time alignment information between the first and second-level sample clocks, besides the locking-edge itself. Thus, it is useful for status monitoring and avoiding any false locks near the rising/falling-edge regions, and is further immune to PVTE variations as the reference clock signals are merely relative in phase. Accordingly, in various examples, the absolute value of left/right-margin defined by the relative phases allows for scaling of the timing margins as the clock rate changes, and further supports a wide data-rate tuning range.

Figure 4:
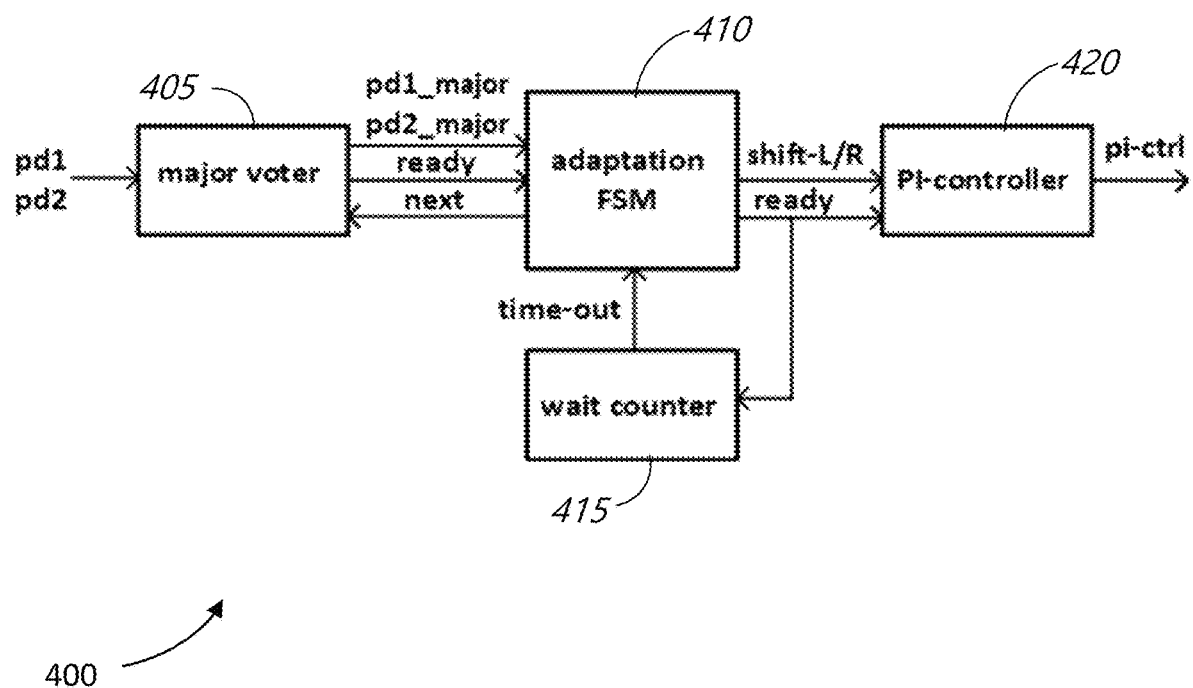
FIG. 4 is a schematic diagram of an adaptation engine, in accordance with various embodiments.

FIG. 4 is a schematic diagram of an adaptation engine 400, in accordance with various embodiments. The adaptation engine 400 may include major voter logic 405, adaptation finite state machine (FSM) 410, wait counter 415, and phase-interpolator (PI) controller 420. It should be noted that the various components of the adaptation engine 400 are schematically illustrated in FIG. 4, and that modifications to the various components and other arrangements of adaptation engine 400 may be possible and in accordance with the various embodiments.

In various embodiments, the major voter logic 405 may be configured to accept, as bit-inputs, the outputs of PD 300, pd1 and pd2. The major voter logic 405 may be coupled to adaptation FSM 410, which may receive, as input, the majority vote of pd1 and pd2, and a ready bit. The adaptation FSM 410 may, in turn, be coupled to PI controller 420 and wait counter 415.

In some examples, the major voter logic 405 may be a logic circuit configured to determine majority voted inputs pd1 and pd2. The major voter logic 405 may, accordingly, average out a noise-effect of the respective outputs pd1/pd2, to produce a de-noised phase-detector result, pd1_major (e.g., majority voted pd1) and pd2_major (e.g., majority voted pd2). The denoised results may then be sent to adaptation FSM 410. Major voter logic 405 may further output a ready signal to the adaptation FSM 410, which may indicate the next results are ready, and receive a next signal from the adaptation FSM 410, which may indicate to the major voter logic 405 to generate the next de-noised results of pd1 and pd2.

Similarly, adaptation FSM 410 may be implemented as digital logic, and configured to determine a left-shift (axLSB) and/or right-shift (bxLSB) of the phase interpolator based on the phase detector's previous output and current output. The PI controller 420 may, thus, update a PI control code, pi-ctrl, based on the determination by the adaptation FSM 410 to shift left or right, and the phase-interpolator's current location (e.g., as determined based on the real clock path second-level ADC clock signals in the respective ADC slices) relative to the first-level clock signal.

In some examples, the wait counter 415 may be set to wait a time-out duration corresponding to a settling time for PI rotation to take effect on the analog side, before the next results are determined. Thus, once the wait counter 415 asserts a time-out signal indicating that the time-out duration has elapsed, the adaptation FSM 410 may complete the cycle by indicating to the major voter 405 to start the next voting cycle.

In various examples, a digital offset may be provided after a lock state has been detected after an adaptation cycle. The digital offset may include a shift of the output of the phase-interpolator to left or right by an additional preset step. The digital offset allows for the offset of any potential systemic differences between the real clock-paths and the replica clock-paths (e.g., of the replicated first-level clock signals and replicated second-level ADC clock signals), and the lock is based on the information provided by replica paths. In further examples, the digital offset provided by the adaptation engine 400 may further allow for the flexibility to re-adjust the left/right time-margin from the hardwired RxT time space for tunable, on-the-fly adjustment of the sampling clock, as will be described in greater detail below with respect to FIG. 5.

Figure 5:
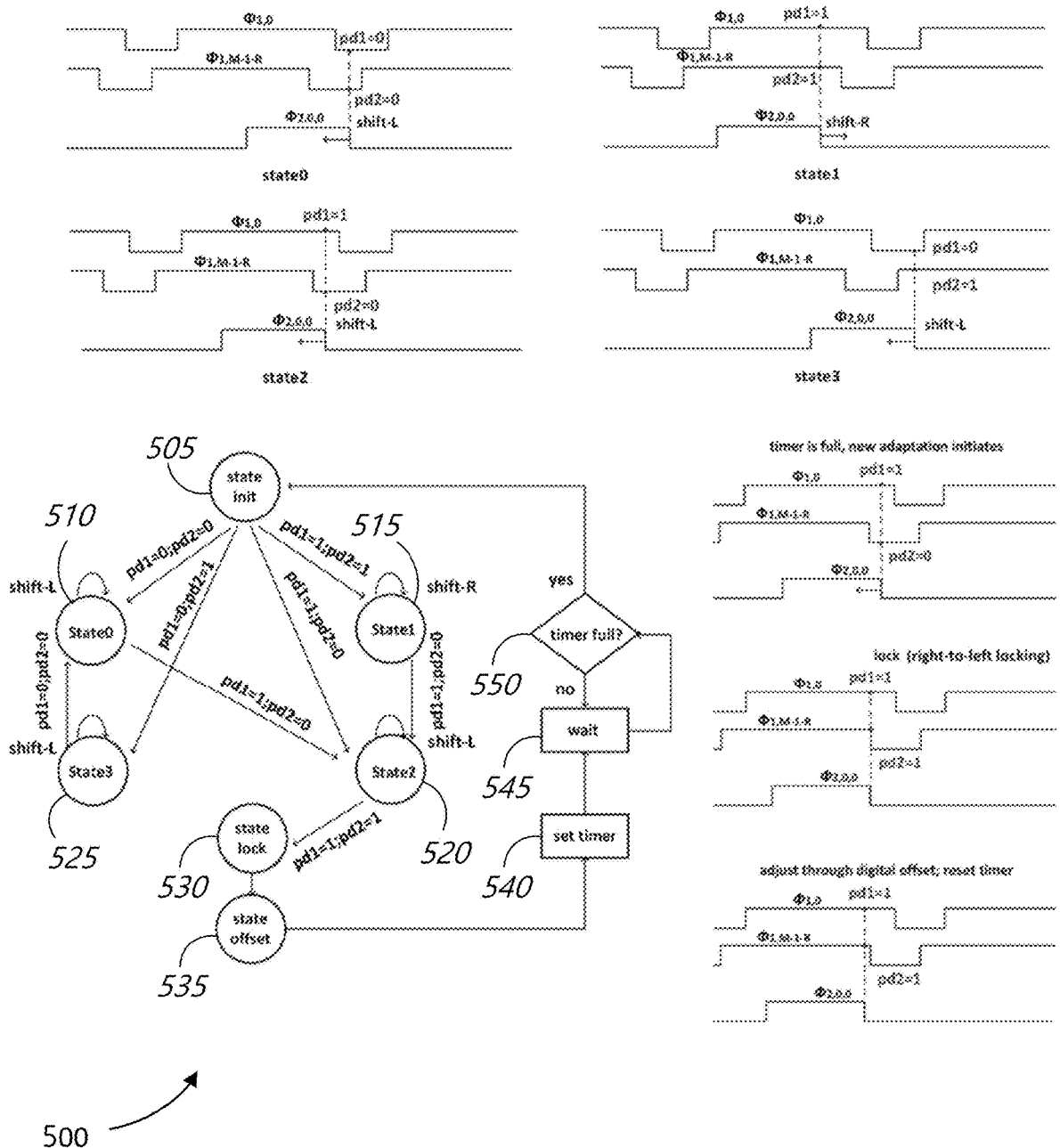
FIG. 5 is a schematic diagram of an adaptation finite state machine, in accordance with various embodiments.

FIG. 5 is a schematic diagram of an adaptation finite state machine 500 (hereinafter "FSM 500"), in accordance with various embodiments. The FSM 500 may begin with state initialization 505, from which one of four states may be entered, state 0 510, state 1 515, state 2 520, and state 3 525. In various embodiments, the relative positions between the first-level track-and-hold clock (e.g., first-level clock signal $\phi_{1,0}$) and second-level ADC clock (e.g., second-level ADC clock signal $\phi_{2,0,0}$) based on the 2-bit phase-detector output (e.g., PD 300) may be used to determine a state.

State 0 510 may correspond to phase detector outputs of pd1=0 (e.g., logic low), and pd2=0 (e.g., logic low). In this state, the FSM 500 may determine that the phase interpolator (e.g., M-phase in/out phase interpolator 200) should shift to the left. State 1 515 may correspond to phase detector outputs of pd1=1 (e.g., logic high) and pd2=1 (e.g., logic high), in which case the phase interpolator should shift to the right. State 2 520 may correspond to phase detector outputs of pd1=1 (e.g., logic high) and pd2=0 (e.g., logic low), in which case the phase interpolator should shift to left. State 3 525 may correspond to phase detector outputs of pd1=0 and pd2=1, in which case the phase-interpolator should shift to the left. In various embodiments, the major voted outputs of the phase detector, pd1_major and pd2_major, may be used as pd1 and pd2 outputs.

In various embodiments, a background adaptation procedure may be implemented via the FSM 500. At the initial step of each adaptation cycle, the current relative position between the first-level track-and-hold clock (e.g., first-level clock signal) and the second-level ADC clock signal may be obtained, at state init 505. Based on the current state (state 0 510, state 1 515, state 2 520, and state 3 525) as determined by the major-voted phase-detector output (e.g., pd1_major and pd2_major). Specifically, the outputs of the phase-interpolator may be shifted left or right, as previously described, until state 2 520 is entered, or pd1=1 and pd2=0. According to some examples, in state 2, the phase interpolator may be shifted left continuously until the condition pd1=1 and pd2=1 is reached from state 2 520, and a state lock 530 is entered.

In various examples, the lock state (e.g., state lock 530) may be detected following the above described with one-directional consistent locking scheme. In other words, once state 2 520 has been entered, the phase interpolator may be consistently shifted in one direction, to the left, to ensure right-to-left locking. In other examples, other locking schemes may be used, such as a left-to-right locking scheme. In various examples, a consistent one-directional locking scheme is adopted, such as a left-to-right locking scheme, or right-to-left locking scheme. In some examples, by utilizing a one-directional locking scheme, the least-significant-bit (LSB) error introduced by the phase-interpolator's last shift at locking may be kept consistent. Specifically, in right-to-left locking, the lock state is always detected as a transition from state 2 to state 1, and thus always absorbs the LSB error as left-margin reduction. Conversely, in a left-to-right locking scheme, the lock state is always detected as a transition from state 1 to state 2, and thus always absorbs the LSB error as right-margin reduction. Thus, by adopting a one-direction locking scheme, the effects of LSB error may be limited to consistently affecting the margin of respective side.

Once a lock state 530 has been detected, and state offset 535 may be entered. In state offset 535, the adaptation FSM 500 may determine and add a digital offset to the phase interpolator based on systemic features and/or settings. As previously described, the digital offset may include a shift of the output of the phase-interpolator to left or right by an additional preset step. The digital offset may allow for the offset of any potential systemic differences between the real clock-paths and the replica clock-paths, and the lock is based on the information provided by replica paths. In further examples, the digital offset may further allow for the flexibility to re-adjust the left/right time-margin from the hard-wired RxT time space for tunable, on-the-fly adjustment of the sampling clock.

In some examples, the timer may be set, at block 540, to a preset value defining the adaptation intervals. Within the FSM 500, the timer may act as a global timer that is utilized after a lock state has been entered, and a digital offset has been determined and/or applied. In some examples, the timer may have a preset value or preset duration, which may be referred to as a global wait duration. In some examples, the global wait duration may be preset according to system requirements or based on performance metrics. For example, the global wait duration may be determined based, at least in part, on power consumption, ambient conditions, such as temperature, or chip-specific variations, such as PVTE variations, and/or performance metrics such as throughput, bandwidth, etc. Thus, once the adaptation 500 has entered a lock state, and the digital offset has been determined, the adaptation FSM 500 may wait, at block 545, for the time-out duration to elapse. When the timer is full, at decision block 550, the adaptation cycle may be re-initiated to determine a current state based on the relative positions of the first-level clock signal and second-level ADC clock signals, and repeat the adaptation process, as previously described, until the next lock-state is achieved.

Figure 6:
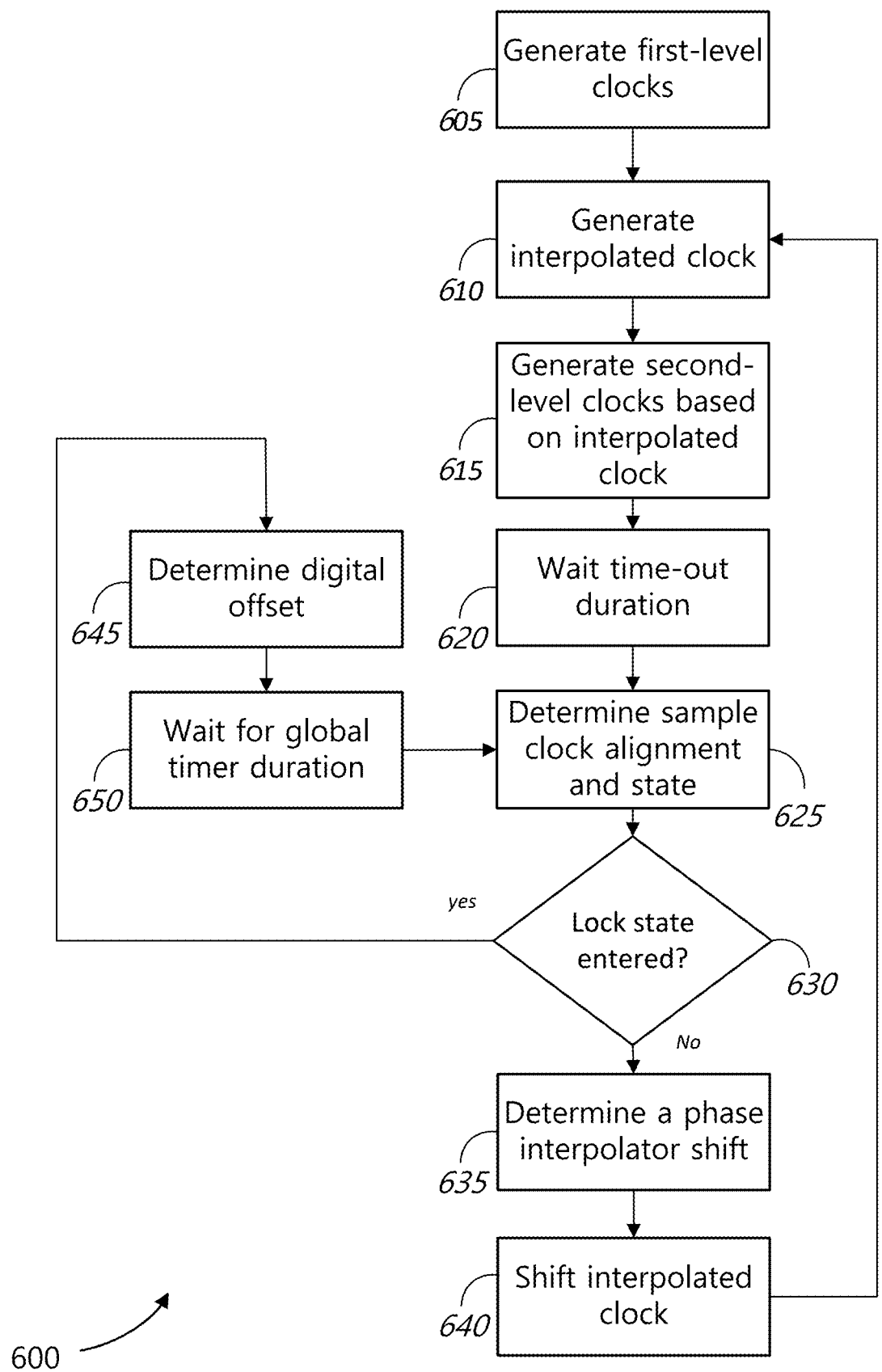
FIG. 6 is a flow diagram of a method for adaptive alignment of sample-clocks, in accordance with various embodiments.

FIG. 6 is a flow diagram of a method 600 for adaptive alignment of sample-clocks, in accordance with various embodiments. The method 600 begins, at block 605, by generating two or more first-level clocks. As previously described, in some examples, a first-level clock may be a first-level clock signal of a T&H circuit, generated based on an input clock signal. In some examples, an input clock signal may include, for example, an I/IB/Q/QB clock from a receiver phase-locked loop (PLL). In some further examples, the two or more first-level clock signals may be generated by dividing the input clock signal via a clock divider, into equal slices, for example, an M-number of ADC slices of a time-interleaved ADC.

The method 600 may continue, at block 610, by generating, an interpolated clock. As previously described, in various embodiments, an interpolated clock may be generated via an M-phase input/M-phase output phase interpolator (e.g., M-phase in/out phase interpolator). In some examples, the M-phase in/out phase interpolator may be configured to receive each of the two or more first-level clock signals. In some examples, each of the two or more first-level clock signals may be offset from a neighboring phase by a phase offset of 1xT. Thus, any two neighboring first-level clock signals may have phase offset of 1xT. Even-numbered first-level clock signals may be fed to a first M/2:1 multiplexer, while odd-numbered first-level clock signals may be fed to a second M/2:1 multiplexer. The multiplexers may be configured to select two neighboring first-level clock signals, cka and ckb. The selected clock signals may subsequently be interpolated. In some examples, interpolating the clock signals may include first weighting each of cka and ckb, and summing the weighted clock signals in vector form. In some examples, the even-numbered first-level clock signal may be weighted by a first weighting factor, wa, and the odd-numbered first-level clock signal may be weighted by a second weighting factor wb. In this way, an interpolated clock signal may be generated by adding the weighted first-level clock signals in vector form, wa*cka+wb*ckb. In some examples, weighted vectors of the respective clock signals cka and ckb may be generated by respective s-bit thermometer DACs. In this way, an interpolated clock signal may be generated with a phase in the 1xT space between neighboring phases of the first-level clock signals, by selection of neighboring phase clock signals, and adjustment of the first and second weighting factors. In some examples, the first and second weighting factors may be adjustable, while in other examples, the first and second weighting factors may be hard-coded via respective logic.

At block 615, the method 600 continues by generating two or more second-level clocks based on the interpolated clock. As previously described, the phase of the second-level clock signals $\phi_{2,i,j}$ inside each ADC slice may move following the output of the M-phase in/out phase interpolator, and specifically the interpolated clock signal. Thus, the interpolated clock signals (including the interpolated clock signal determined above) may cover the whole MxT time period of a respective first-level clock signal, and the two or more second-level clock signals may be generated based on the interpolated clock signal.

At block 620, the method 600 continues by waiting a time-out duration. In various examples, the time-out duration may be determined based on a time required for settling of the PI rotation to take effect on the analog side. In some examples, the time-out duration may be controlled via a counter or other suitable hardware.

The method 600 continues, at block 625, by determining sample clock alignment. As previously described, in some examples, an alignment target may be set to adaptively keep the falling-edge (sample-edge) of second-level ADC clock from the falling-edge of first-level clock by a time space RxT. Thus, in some examples, RxT may be set to (PxT−QxT)/2, which is half of the margin where the falling-edge of the second-level ADC clock is even with the falling-edge of the first-level clock of a phase offset M−1−R. Such an arrangement may help ensure the left-margin & right-margins are evenly distributed (e.g., set equal to each other) based on replicated clock signals.

Thus, by using an (M−1−R)th first-level clock signal, where M−1−R is an integer, the phase relationship between the first-level clock signals may be utilized to generate the proper time margin. In other words, inherent time differences between the different phases of the first-level clock signal are utilized to set-up references for time-margins. Specifically, in some examples, the replicated first-level clock signal $\phi_{1,0}$ may be used as the reference of pd1, and replicated first-level clock signal $\phi_{1,M-1-R}$ as the reference of pd2. For the right-margin, the two reference waveforms may be sampled by the falling-edge of the replicated second-level ADC clock $\phi_{2,0,0}$ to create RxT right-margin.

Any time violation may lead to overlap of the settling time window of track-hold and ADC. A right-margin may be the time-space between falling-edge (sample-edge) of the first-level track-hold clock and the falling-edge (hold-edge) of the second-level ADC clock. Any time violation may lead to incorrect sampled data. Thus, sample clocks may be aligned to ensure appropriate left and right-margins. In some examples, the alignment of sample clocks may be determined using a phase detector, such as a 2-bit phase detector, as previously described with respect to FIG. 3.

In further embodiments, a current state of an adaptation FSM may be determined based on the sample clock alignment (e.g., output of the phase detector). As previously described, an adaptation engine may be implemented to determine sample clock alignment, and to shift phase interpolator until alignment has been achieved. As previously described, the adaptation engine may include a major voter, configured to determine a majority vote for the outputs of the phase detector, pd1 and pd2. In effect, the major voter circuit may be configured to produce a de-noised output of the phase detector for further adaptation and alignment of sample clocks. Based on the de-noised output of the phase detector, a current state may be determined as one of four states: state 0, state 1, state 2, and state 3. Each state may correspond to different phase detector outputs pd1 and pd2, which may indicate an alignment of the sample clocks.

The method 600 continues, at 630, by determining whether a lock state has been entered. As previously described, a lock state may be determined based on a locking scheme. As previously described, a consistent one-directional locking scheme may be implemented, such as a left-to-right locking scheme, or right-to-left locking scheme. In some examples, by utilizing a one-directional locking scheme, the LSB error introduced by the phase-interpolator's last shift at locking may be kept consistent. Specifically, in right-to-left locking, the lock state is always detected as a transition from state 2 to state 1, and thus always absorbs the LSB error as left-margin reduction. Conversely, in a left-to-right locking scheme, the lock state is always detected as a transition from state 1 to state 2, and thus always absorbs the LSB error as right-margin reduction. Thus, by adopting a one-direction locking scheme, the effects of LSB error may be limited to consistently affecting the margin of respective side. Thus, in some examples, a lock state may be determined based on a specific state transition.

If it is determined that a lock state has not been entered, the method 600 may continue, at block 635, by determining a phase interpolator shift. As previously described, in various embodiments, a phase interpolator shift may include a left-shift or a right-shift of the phase interpolator, based on the phase detector's previous output and current output (e.g., the state of the adaptation state machine). Specifically, in some examples, an adaptation engine may be implemented to determine a phase shift, and adjust the phase interpolator. As previously described, the adaptation engine may determine a state based on the outputs of a phase detector, and each state may further correspond to shifts left or shifts right of the phase interpolator. Once the shift left or right has been determined, based on the state, the method 600 may continue, at block 640, by shifting the phase interpolator and in turn, the interpolated clock. As previously described, in examples, to shift the interpolated clock signal, a PI controller may update a PI control code, pi-ctrl, based on the determination by the adaptation FSM to shift left or right (including digital offsets and/or state-based left or right shifts), and the phase-interpolator's current location (e.g., as determined based on the real clock path second-level ADC clock signals in the respective ADC slices) relative to the first-level clock signal. In some examples, the pi-ctrl may include code for selection of neighboring phase first-level clock signals in order to effect the left or right shift. In some further examples, pi-ctrl may include code for adjusting a weighting factor to create the left and/or right shift within the 1xT space between neighboring phases. Once the interpolated clock has been shifted, the method 600 may, at block 610, generate an updated (e.g., shifted) interpolated clock signal from which updated second-level clocks may be generated.

If, at block 630, it is determined that a lock state has been entered, the method may continue, at block 645, by determining a digital offset. As previously described, once a lock state has been detected, the adaptation FSM may determine a digital offset to be added to the phase interpolator based on settings. As previously described, the digital offset may include a shift of the output of the phase-interpolator to left or right by an additional preset step. The digital offset may allow for the offset of any potential systemic differences between the real clock-paths and the replica clock-paths, and the lock is based on the information provided by replica paths. In further examples, the digital offset may further allow for the flexibility to re-adjust the left/right time-margin from the hardwired RxT time space for tunable, on-the-fly adjustment of the sampling clock. Once digital offsets have been determined, the digital offset may similarly be provided to a PI controller to effect a corresponding shift to the interpolated clock signal.

The method 600 may continue, at block 650, by waiting for a global timer duration. As previously described, in some examples, the timer may have a preset value or preset duration, which may be referred to as a global wait duration. In some examples, the global wait duration may be preset according to system requirements or based on performance metrics. For example, the global wait duration may be determined based, at least in part, on power consumption, ambient conditions, such as temperature, or chip-specific variations, such as PVTE variations, and/or performance metrics such as throughput, bandwidth, etc. When the timer is full, at block 625, the method may continue, by re-initiating the adaptation process by again determining a current sample clock alignment and current state based on the relative positions of the first-level clock signal and second-level ADC clock signals.

The techniques and processes described above with respect to various embodiments may be performed by one or more systems 100 and/or subsystems and components thereof, such as PI 200, PD 300, adaptation engine 400, and FSM 500 described above with respect to FIGS. 1-5, and which may perform the methods provided by various other embodiments, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A method comprising:
generating, via a first clock generator, two or more first-level clock signals of a track and hold circuit based on an input clock signal, each of the two or more first-level clock signals separated by a phase offset of 1xT from a respective first-level clock signal of a neighboring phase;
generating, via a phase interpolator, an interpolated clock signal, wherein
generating the interpolated clock signal further comprises:
selecting an even-numbered first-level clock signal of the two or more clock signals;
selecting an odd-numbered first-level clock signal of the two or more clock signals, the odd-numbered first-level clock signal having a phase neighboring a phase of the even-numbered first-level clock signal;
generating the interpolated clock signal based on the even-numbered first-level clock signal and the odd-numbered first-level clock signal, wherein the interpolated clock signal has a phase within the 1xT phase offset between the even-numbered and odd-numbered first-level clock signals; and
generating, via a second clock generator, two or more second-level clock signals based on the interpolated clock signal, wherein the phase of the two or more second-level clock signals relative to the phase of a respective first-level clock signal is determined, at least in part, by the phase of the interpolated clock signal.

2. The method of claim 1, wherein generating the interpolated clock signal further comprises:
weighting the even-numbered first-level clock signal by a first weighting factor to produce a weighted even-numbered first-level clock signal;
weighting the odd-numbered first-level clock signal by a second weighting factor to produce a weighted odd-numbered first-level clock signal;
adding the weighted even-numbered first-level clock signal and the weighted odd-numbered first-level clock signal in vector form, wherein adding the vector forms of the even-numbered first-level clock signal and odd-numbered first-level clock signal are generated via respective digital-to-analog converters.

3. The method of claim 1, further comprising:
determining alignment between a first second-level clock signal and a first first-level clock signal, wherein determining an alignment between the first second-level clock signal and the first first-level clock signal includes determining a phase offset between a falling edge of the first first-level clock signal and a falling edge of the first second-level clock signal; and
shifting the interpolated clock signal based on the phase offset.

4. The method of claim 3, wherein determining alignment between the first second-level clock signal and the first first-level clock signal further comprises:
receiving, at an input of a first phase-detector of a 2-bit phase detector, a replicated first first-level clock signal;
receiving, at an input of a second phase-detector of the 2-bit phase detector, a replicated second first-level clock signal, wherein the second first-level clock signal is phase shifted from the first first-level clock signal by a time-margin;
receiving, at the first and second phase-detectors, a replicated first second-level clock signal as a clock input;
producing a first phase-detector output indicative of a value of the first first-level clock signal; and
producing a second phase-detector output indicative of a value of the second first-level clock signal.

5. The method of claim 4, further comprising:
determining a phase interpolator shift based, at least in part, on the first phase-detector output and second phase-detector output, wherein determining the phase interpolator shift includes determining a state based on the first phase-detector output and the second phase-detector output; and
shifting a phase of the interpolated clock signal by the phase interpolator shift until a lock state is entered.

6. The method of claim 5, wherein the state is one of a first state, a second state, a third state, or a fourth state,
wherein in the first state, the first phase-detector output and second phase-detector output are both logic low, and the phase interpolator shift is left,
wherein in the second state, the first phase-detector output and second phase-detector output are both logic high, and the phase interpolator shift is right,
wherein in the third state, the first phase-detector output is logic high and the second phase-detector output is logic low, and the phase interpolator shift is left,
wherein in the fourth state, the first phase-detector output is logic low and the second phase-detector output is logic high, and the phase interpolator shift is left.

7. The method of claim 6, wherein the lock state is entered according to a locking scheme, wherein the method further comprises:
entering the lock state in response to determining that the first state has been entered from the second state;
determining, in response to entering the lock state, a digital offset based, at least in part, on a difference between a real clock path of the first second-level clock signal and a replica clock path of the replicated first second-level clock signal.

8. A clock generator comprising:
a first clock generator configured to receive an input clock signal, and generate two or more first-level clock signals of a track-and-hold circuit;
a phase interpolator configured to generate an interpolated clock signal, wherein the interpolated clock signal is generated based on the two or more first-level clock signals, wherein the phase interpolator comprises:
a first multiplexer configured to receive even-numbered first-level clock signals of the two or more first-level clock signals;
a second multiplexer configured to receive odd-numbered first-level clock signals of the two or more first-level clock signals; and
a second clock generator configured to generate two or more second-level clock signals based on the interpolated clock signal, wherein the phase of the two or more second-level clock signals relative to the phase of a respective first-level clock signal is determined, at least in part, by the phase of the interpolated clock signal.

9. The clock generator of claim 8, wherein the phase interpolator further comprises:
a first digital-to-analog converter configured to generate a first vector of a selected even-numbered first-level clock signal from the first multiplexer, weighted by a first weighting factor; and
a second digital-to-analog converter configured to generate a second vector of a selected odd-numbered first-level clock signal from the second multiplexer, weighted by a second weighting factor;
wherein the outputs of the first and second digital-to-analog converters are configured to be added, wherein the added first and second vectors form the interpolated clock signal, wherein the respective interpolated clock signal has a phase within the 1xT phase offset between the even-numbered and odd-numbered first-level clock signals.

10. The clock generator of claim 8, further comprising:
a 2-bit phase detector coupled to the first clock generator, second clock generator, and phase interpolator, the 2-bit phase detector configured to determine an alignment between a first second-level clock signal and a first first-level clock signal, wherein determining an alignment between the first second-level clock signal and the first first-level clock signal includes determining a phase offset between a falling edge of the first first-level clock signal and a falling edge of the first second-level clock signal.

11. The clock generator of claim 10, wherein the 2-bit phase detector includes:
a first phase-detector configured to receive a replicated first first-level clock signal at an input of the first phase-detector, and a replicated first second-level clock signal at a clock input of the first phase-detector;
a second phase-detector configured to receive a replicated second first-level clock signal and the replicated first second-level clock signal at a clock input of the second phase-detector, wherein the second first-level clock signal is phase shifted from the first first-level clock signal by a time-margin;
wherein the first phase-detector is configured to produce a first phase-detector output indicative of a value of the first first-level clock signal; and
wherein the second phase-detector is configured to produce a second phase-detector output indicative of a value of the second first-level clock signal.

12. The clock generator of claim 11, further comprising:
an adaptation finite state machine configured to determine a phase interpolator shift based, at least in part, on the first phase-detector output and second phase-detector output, wherein determining the phase interpolator shift includes determining a state based on the first phase-detector output and second phase-detector output.

13. The clock generator of claim 12, wherein the state is one of a first state, a second state, a third state, or a fourth state,
wherein in the first state, the first phase-detector output and second phase-detector output are both logic low, and the phase interpolator shift is left,
wherein in the second state, the first phase-detector output and second phase-detector output are both logic high, and the phase interpolator shift is right,
wherein in the third state, the first phase-detector output is logic high and the second phase-detector output is logic low, and the phase interpolator shift is left,
wherein in the fourth state, the first phase-detector output is logic low and the second phase-detector output is logic high, and the phase interpolator shift is left.

14. The clock generator of claim 13, wherein a lock state is entered according to a locking scheme, wherein the adaptation finite state machine is configured to enter the lock state in response to determining that the first state has been entered from the second state, and wherein the adaptation finite state machine is further configured to determine, in response to entering the lock state, a digital offset based, at least in part, on a difference between a real clock path of the first second-level clock signal and a replica clock path of the replicated first second-level clock signal.

15. An analog-to-digital converter comprising:
a first clock generator configured to receive an input clock signal, and generate two or more first-level clock signals of a track-and-hold circuit;
a phase interpolator configured to generate two or more respective interpolated clock signals, wherein each respective interpolated clock signal is generated based on the two or more first-level clock signals, wherein the phase interpolator further comprises two or more phase interpolator slices, each respective phase interpolator slice further comprising:
a first multiplexer configured to receive even-numbered first-level clock signals of the two or more first-level clock signals;
a second multiplexer configured to receive odd-numbered first-level clock signals of the two or more first-level clock signals;
two or more analog-to-digital converter slices, each respective analog-to-digital converter slice comprising:
a second clock generator configured to generate two or more second-level clock signals based on the respective interpolated clock signal, wherein the phase of the two or more second-level clock signals relative to the phase of a respective first-level clock signal is determined, at least in part, by the phase of the respective interpolated clock signal.

16. The analog-to-digital converter of claim 15, wherein each phase interpolator slice further comprises:
a first digital-to-analog converter configured to generate a first vector of a selected even-numbered first-level clock signal from the first multiplexer, weighted by a first weighting factor; and
a second digital-to-analog converter configured to generate a second vector of a selected odd-numbered first-level clock signal from the second multiplexer, weighted by a second weighting factor;

wherein the outputs of the first and second digital-to-analog converters are configured to be added, wherein the added first and second vectors form the interpolated clock signal, wherein the respective interpolated clock signal has a phase within the 1xT phase offset between the even-numbered and odd-numbered first-level clock signals.

17. The analog-to-digital converter of claim 15, further comprising:
a 2-bit phase detector coupled to the first clock generator, second clock generator, and phase interpolator, the 2-bit phase detector configured to determine an alignment between a first second-level clock signal and a first first-level clock signal, wherein determining an alignment between the first second-level clock signal and the first first-level clock signal includes determining a phase offset between a falling edge of the first first-level clock signal and a falling edge of the first second-level clock signal.

18. The analog-to-digital converter of claim 17, wherein the 2-bit phase detector includes:
a first phase-detector configured to receive a replicated first first-level clock signal at an input of the first phase-detector, and a replicated first second-level clock signal at a clock input of the first phase-detector;
a second phase-detector configured to receive a replicated second first-level clock signal and the replicated first second-level clock signal at a clock input of the second phase-detector, wherein the second first-level clock signal is phase shifted from the first first-level clock signal by a time-margin;
wherein the first phase-detector is configured to produce a first phase-detector output indicative of a value of the first first-level clock signal; and
wherein the second phase-detector is configured to produce a second phase-detector output indicative of a value of the second first-level clock signal.

19. The analog-to-digital converter of claim 18, further comprising:
an adaptation finite state machine configured to determine a phase interpolator shift based, at least in part, on the first phase-detector output and second phase-detector output, wherein determining the phase interpolator shift includes determining a state based on the first phase-detector output and second phase-detector output.

20. The analog-to-digital converter of claim 19, wherein a lock state is entered according to a locking scheme, wherein the adaptation finite state machine is configured to enter the lock state in response to determining that the first state has been entered from the second state, and wherein the adaptation finite state machine is further configured to determine, in response to entering the lock state, a digital offset based, at least in part, on a difference between a real clock path of the first second-level clock signal and a replica clock path of the replicated first second-level clock signal.

* * * * *